(12) United States Patent
Blumrich et al.

(10) Patent No.: US 7,650,434 B2
(45) Date of Patent: Jan. 19, 2010

(54) GLOBAL TREE NETWORK FOR COMPUTING STRUCTURES ENABLING GLOBAL PROCESSING OPERATIONS

(75) Inventors: Matthias A. Blumrich, Ridgefield, CT (US); Dong Chen, Croton-On-Hudson, NY (US); Paul W. Coteus, Yorktown Heights, NY (US); Alan G. Gara, Mount Kisco, NY (US); Mark E. Giampapa, Irvington, NY (US); Philip Heidelberger, Cortlandt Manor, NY (US); Dirk Hoenicke, Ossining, NY (US); Burkhard D. Steinmacher-Burow, Mount Kisco, NY (US); Todd E. Takken, Mount Kisco, NY (US); Pavlos M. Vranas, Bedford Hills, NY (US)

(73) Assignee: International Business Machines Corporation, Armonk, NY (US)

( * ) Notice: Subject to any disclaimer, the term of this patent is extended or adjusted under 35 U.S.C. 154(b) by 391 days.

(21) Appl. No.: 10/469,000

(22) PCT Filed: Feb. 25, 2002

(86) PCT No.: PCT/US02/05586

§ 371 (c)(1),
(2), (4) Date: Aug. 22, 2003

(87) PCT Pub. No.: WO02/069168

PCT Pub. Date: Sep. 6, 2002

(65) Prior Publication Data

US 2004/0078493 A1 Apr. 22, 2004

Related U.S. Application Data

(60) Provisional application No. 60/271,124, filed on Feb. 24, 2001.

(51) Int. Cl.
*G06F 15/16* (2006.01)

(52) U.S. Cl. .................... 709/252; 709/250; 712/11; 712/200

(58) Field of Classification Search .................. 712/225, 712/200, 11, 12, 10, 214; 709/250, 252
See application file for complete search history.

(56) References Cited

U.S. PATENT DOCUMENTS 4,845,744 A 7/1989 Debenedictis et al.

(Continued)

FOREIGN PATENT DOCUMENTS

JP 01-505660 3/1988

OTHER PUBLICATIONS

Middleton, D., Dynamically Allocating Sets of Fine-Grained Processors to Running Computations, Frontiers of Massively Parallel Computation, 1988, Proceedings of the 2nd Symposium on the Frontiers of Fairfax, VA, USA, Oct. 10-12, 1988, Washington DC, USA, IEEE Comput. Soc. PR, US, Oct. 10, 1988 pp. 191-194.

*Primary Examiner*—Niketa Patel
*Assistant Examiner*—Benjamin P Geib
(74) *Attorney, Agent, or Firm*—Scully, Scott, Murphy & Presser, P.C.; Daniel P. Morris, Esq.

(57) ABSTRACT

A system and method for enabling high-speed, low-latency global tree network communications among processing nodes interconnected according to a tree network structure. The global tree network enables collective reduction operations to be performed during parallel algorithm operations executing in a computer structure having a plurality of the interconnected processing nodes. Router devices are included that interconnect the nodes of the tree via links to facilitate performance of low-latency global processing operations at nodes of the virtual tree and sub-tree structures. The global operations performed include one or more of: broadcast operations downstream from a root node to leaf nodes of a virtual tree, reduction operations upstream from leaf nodes to the root node in the virtual tree, and point-topoint message passing from any node to the root node. The global tree network is configurable to provide global barrier and interrupt functionality in asynchronous or synchronized manner, and, is physically and logically partitionable.

33 Claims, 3 Drawing Sheets-

U.S. PATENT DOCUMENTS

| | | |
|---|---|---|
| 4,860,201 A | 8/1989 | Stolfo et al. |
| 5,191,578 A * | 3/1993 | Lee ............................ 370/418 |
| 5,224,100 A | 6/1993 | Lee et al. |
| 5,353,412 A | 10/1994 | Douglas et al. |
| 5,367,692 A | 11/1994 | Edelman et al. |
| 5,721,921 A * | 2/1998 | Kessler et al. ............... 718/102 |
| 5,802,278 A * | 9/1998 | Isfeld et al. ................. 709/249 |

* cited by examiner

GLOBAL TREE NETWORK FOR COMPUTING STRUCTURES ENABLING GLOBAL PROCESSING OPERATIONS

CROSS-REFERENCE TO RELATED APPLICATION

The present invention claims the benefit of commonly-owned, U.S. Provisional Patent Application Ser. No. 60/271,124 filed Feb. 24, 2001 entitled MASSIVELY PARALLEL SUPERCOMPUTER, the whole contents and disclosure of which is expressly incorporated by reference herein as if fully set forth herein. This patent application is additionally related to the following commonly-owned, co-pending United States patent applications filed on even date herewith, the entire contents and disclosure of each of which is expressly incorporated by reference herein as if fully set forth herein. U.S. Pat. No. 7,587,516, issued Sep. 8, 2009, for "Class Network Routing"; U.S. Patent Application Publication No. 2004-0078493, published Apr. 22, 2004, for "A Global Tree Network for Computing Structures Enabling Global Processing Operations"; U.S. Pat. No. 7,444,385, issued Oct. 28, 2008, for "Global Interrupt and Barrier Networks"; U.S. Pat. No. 7,305,487, issued Dec. 4, 2007, for "Optimized Scalable Network Switch"; U.S. Pat. No. 7,313,582, issued Dec. 25, 2007, for "Arithmetic Functions in Torus and Tree Networks"; U.S. Pat. No. 7,418,068, issued Aug. 26, 2008, for "Data Capture Technique for High Speed Signaling"; U.S. Patent Application Publication No. 2007-0055825, published Mar. 8, 2007, for "Managing Coherence Via Put/Get Windows"; U.S. Pat. No. 7,174,434, issued Feb. 6, 2007, for "Resource Locking In A Multiprocessor System"; U.S. Pat. No. 7,330,996, issued Feb. 12, 2008, for "Twin-Tailed Fail-Over for Fileservers Maintaining Full Performance in the Presence of A Failure"; U.S. Pat. No. 7,210,088, issued Apr. 24, 2007, for "Fault Isolation Through No-Overhead Link Level CRC"; U.S. Patent Application Publication No. 2004-0083293, published Apr. 29, 2004, for "Ethernet Addressing Via Physical Location for Massively Parallel Systems"; U.S. Pat. No. 7,185,226, issued Feb. 27, 2007, for "Fault Tolerance in a Supercomputer Through Dynamic Repartitioning"; U.S. Pat. No. 6,895,416, issued May 17, 2005, for "Checkpointing Filesystem"; U.S. Pat. No. 7,315,877, issued Jan. 1, 2008, for "Efficient Implementation of Multidimensional Fast Fourier Transform on a Distributed-Memory Parallel Multi-Node Computer"; and U.S. Pat. No. 7,555,566, issued Jun. 30, 2009, for "A Novel Massively Parallel Supercomputer".

This invention was made with Government support under subcontract number B517552 under prime contract number W-7405-ENG-48 awarded by the Department of Energy. The Government has certain rights in this invention.

BACKGROUND OF THE INVENTION

1. Field of the Invention

This invention relates generally to the field of distributed-memory message-passing parallel computer design and system software, and more particularly, to a novel method and apparatus for interconnecting individual processors for use in a massively-parallel, distributed-memory computer, for example.

2. Discussion of the Prior Art

Massively parallel computing structures (also referred to as "ultra-scale computers" or "supercomputers") interconnect large numbers of compute nodes, generally, in the form of very regular structures, such as grids, lattices or tori.

One problem commonly faced on such massively parallel systems is the efficient computation of a collective arithmetic or logical operation involving many nodes. A second problem commonly faced on such systems is the efficient sharing of a limited number of external I/O connections by all of the nodes. One example of a common computation involving collective arithmetic operations over many compute nodes is iterative sparse linear equation solving techniques that require a global inner product based on a global summation.

While the three-dimensional torus interconnect computing structure 10 shown in FIG. 1 comprising a simple 3-dimensional nearest neighbor interconnect which is "wrapped" at the edges, works well for most types of inter-processor communication, it does not perform as well for collective operations such as reductions, where a single result is computed from operands provided by each of the compute nodes 12, or efficient sharing of limited resources such as external I/O connections (not shown).

It would thus be highly desirable to provide an ultra-scale supercomputing architecture that comprises a unique interconnection of processing nodes optimized for efficiently and reliably performing many classes of operations including those requiring global arithmetic operations such as global reduction computations, data distribution, synchronization, and limited resource sharing.

The normal connectivity of high-speed networks such as the torus are simply not fully suited for this purpose because of longer latencies.

That is, mere mapping of a tree communication pattern onto the physical torus interconnect results in a tree of greater depth than is necessary if adjacent tree nodes are required to be adjacent on the torus, or a tree with longer latency between nodes when those nodes are not adjacent in the torus. In order to compute collective operations most efficiently when interconnect resources are limited, a true tree network is required, i.e., a network where the physical interconnections between nodes form the nodes into a tree.

SUMMARY OF THE INVENTION

It is an object of the present invention to provide a system and method for interconnecting individual processing nodes of a computing structure so that they can efficiently and reliably compute global reductions, distribute data, synchronize, and share limited resources.

It is another object of the present invention to provide an independent single physical network interconnecting individual processors of a massively-parallel, distributed-memory computer that is arranged as a tree interconnect and facilitates global, arithmetic and collective operations.

It is still another object of the present invention to provide an independent single physical network interconnecting individual processors of a massively-parallel, distributed-memory computer that is arranged as a global tree interconnect for providing external (input/output) I/O and service functionality to one or more nodes of a virtual tree network which is a sub-tree of the physical network. Such a global tree interconnect system may include dedicated I/O nodes for keeping message traffic off of a message-passing torus or grid computing structure.

According to the invention, there is provided a system and method for enabling high-speed, low-latency global communications among processing nodes interconnected according to a tree network structure. The global tree network optimally enables collective reduction operations to be performed during parallel algorithm operations executing in a computer structure having a plurality of the interconnected processing nodes. Router devices are included that interconnect the nodes of the tree via links to facilitate performance of low-latency global processing operations at nodes of the tree. Configuration options are included that allow for the definition of "virtual trees" which constitute subsets of the total nodes in the tree network. The global operations include one or more of: global broadcast operations downstream from a root node to leaf nodes of a virtual tree, global reduction operations upstream from leaf nodes to root node in the virtual tree, and point-to-point message passing from any node to the root node in the virtual tree. One node of the virtual tree network is coupled to and functions as an I/O node for providing I/O functionality with an external system for each node of the virtual tree. The global tree network may be configured to provide global barrier and interrupt functionality in asynchronous or synchronized manner. This is discussed in co-pending application U.S. patent application Ser. No. (YOR920,020,029US1 (15272)). Thus, parallel algorithm processing operations, for example, employed in parallel computing systems, may be optimally performed in accordance with certain operating phases of the parallel algorithm operations. When implemented in a massively-parallel supercomputing structure, the global tree network is physically and logically partitionable according to the needs of a processing algorithm.

In a massively parallel computer, all of the compute nodes generally require access to external resources such as a filesystem. The problem of efficiently sharing a limited number of external I/O connections arises because the cost of providing such a connection is significantly higher than the cost of an individual compute node. Therefore, efficient sharing of the I/O connections insures that I/O bandwidth does not become a limiting cost factor for system scalability. Assuming limited inter-processor interconnect, the most efficient network for sharing a single resource, in terms of average latency, is the global tree, where the shared resource is at the root of the tree.

For global and collective operations, a single, large tree may be used to interconnect all processors. However, filesystem I/O requires many, small trees with I/O facilities at the root. Because a large tree comprises multiple, smaller subtrees, the single, large tree may be used for filesystem I/O by strategically placing external connections within it at the roots of appropriately-sized subtrees. Additionally, filesystem I/O requires point-to-point messaging which is enabled by the present invention and is not required for collective operations.

Advantageously, a scalable, massively parallel supercomputer incorporating the global tree network of the invention is well-suited for parallel algorithms performed in the field of life sciences.

BRIEF DESCRIPTION OF THE DRAWINGS

Further features, aspects and advantages of the apparatus and methods of the present invention will become better understood with regard to the following description, appended claims, and the accompanying drawings where:

DETAILED DESCRIPTION OF THE PREFERRED EMBODIMENTS

Figure 1:
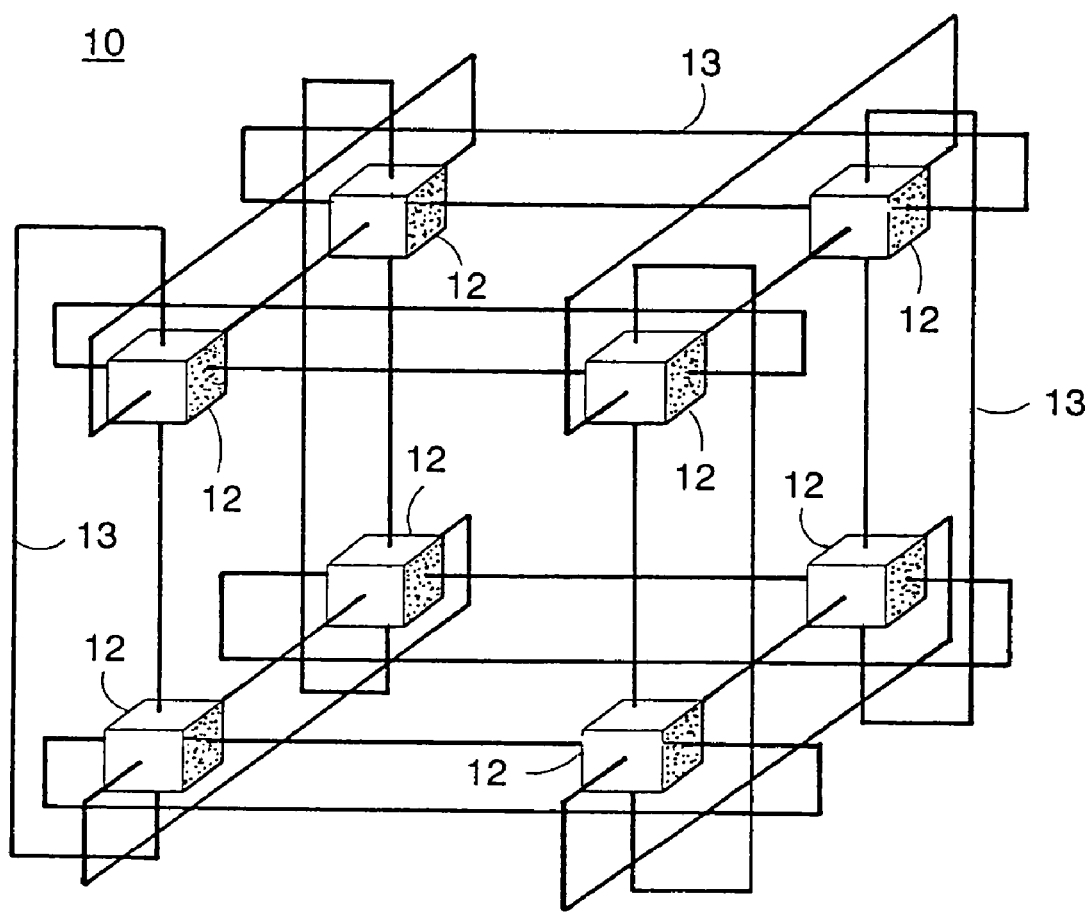
FIG. 1 depicts a three-dimensional torus network interconnecting eight computing nodes.

The present invention may be implemented in a computer structure such as described in herein-incorporated, commonly-owned, co-pending U.S. patent application Ser. No. 10/468,993 which describes a novel Massively Parallel Supercomputer architecture in the form of a three-dimensional torus designed to deliver processing power on the order of teraOPS (trillion floating-point operations per second) for a wide range of applications. The Massively Parallel supercomputer architecture, in the exemplary embodiment described, comprises 65,536 processing nodes organized as a 64×32×32 three-dimensional torus with each processing node connected to six (6) neighboring nodes 12 via 6 bi-directional torus links 13 as depicted in the three-dimensional torus sub-cube portion 10 shown in FIG. 1. FIG. 1 shows such a torus consisting of eight (8) nodes 12, and it is clear to see how this interconnect scales by increasing the number of nodes 12 along all three dimensions. With current technology, this architecture can be leveraged to hundreds of teraOPS for applications that require significantly more computation than communication or which require only nearest neighbor communications. It should be understood that the present invention may be implemented in many other computer structures besides a supercomputer.

As mentioned, the interconnect network connecting the torus processing nodes works well for most types of inter-processor communication but not for collective operations such as reductions, where a single result is computed from operands provided by each of the nodes.

As described in herein incorporated commonly-owned, co-pending U.S. Pat. No. 7,555,566, issued Jun. 30, 2009, the most efficient mechanism for performing a collective reduction operation on the torus, in terms of minimum latency, is to provide a true tree network, i.e., a network where the physical interconnections between nodes form the nodes into a tree.

Thus, according to a preferred embodiment of the invention, a global tree network is provided that comprises a plurality of interconnected router devices, one per node ASIC. Each router provides three "child" ports and one "parent" port, each of which is selectively enabled. Two child ports are sufficient to create a tree topology. More children reduce the height of the tree, or connections required to reach the root. Thus, more children can reduce the latency for collective operations at the expense of more interconnections. The tree is formed by starting with a "root" node that has no parent (i.e., nothing connected to its parent port). The root node forms the topmost "level" of the tree. The next level down is formed by connecting one or more of the root's child ports to parent ports of other routers. In this case, the root node is the "parent" of the nodes in the level below it. This process continues recursively until nodes are reached that have no children (i.e., nothing connected to any of their router's child ports). These nodes are referred to as the "leaves" of the tree. For example, as shown in the example tree network 100 of FIG. 2, node B 110 is the root node, and the leaves are the nodes 120 at the bottom farthest from the root node. As referred to herein, data moving up the tree, toward the root, is referred to as "uptree" traffic while data traveling away from the root, toward the leaves is referred to as "downtree" traffic.

As will be described in greater detail, the tree network may include a number of independent "virtual networks", supported by virtual channels on the links interconnecting the routers (nodes). In order to share the links, virtual network data streams are packetized and interleaved in a fair manner. Each of the virtual networks has its own storage resources, and a functional deadlock in one will not affect the other.

Each virtual network may be further subdivided into virtual trees (or sub-trees), which may or may not be independent (within each virtual network). Any node may be configured to be the root of one of sixteen virtual trees. A virtual tree comprises the node designated as the root and all of its children, except a) nodes that are also designated as roots of the same virtual tree number, and b) children of nodes satisfying a). Therefore, the virtual trees with the same virtual tree number cannot overlap, but virtual trees with different numbers can.

Nodes may be configured to participate in any number of virtual trees, or none. If they participate, then they are expected to follow all tree semantics, such as contributing operands to reduction operations. As nodes may participate in multiple virtual trees, they must specify a virtual tree number for every packet they inject into a virtual network.

Figure 2:
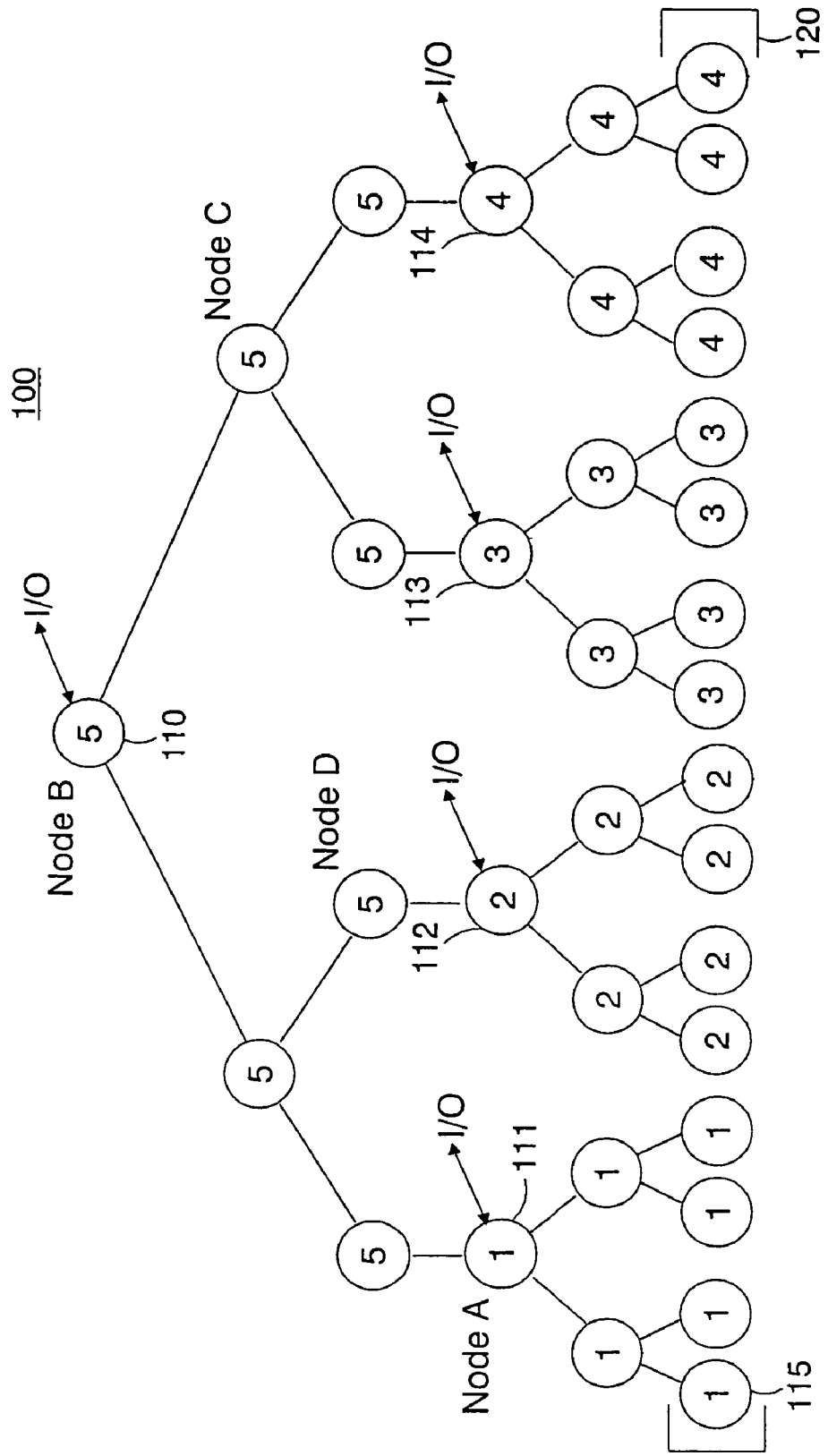
FIG. 2 depicts an example of a typical system including thirty-five (35) nodes (represented by circles), and a tree network 100 connecting all the nodes.

An example tree structure 100 used in accordance with the invention is shown in FIG. 2. More particularly, FIG. 2 depicts an example of a virtual tree network including thirty-five (35) nodes (represented by circles), and a tree network 100 connecting all the 35 nodes. The tree network 100 is used for global reductions and broadcast as will be described in greater detail. For the purpose of input/output (I/O) and resource sharing with external systems, the nodes of the example virtual network 100 of FIG. 2 are grouped into five (5) non-overlapping virtual sub-trees referenced in FIG. 2 as virtual trees 1-5. That is, each of the virtual sub-trees is indicated by a different number within the circles. The respective nodes 111, 112, 113, 114 and node 110 at the root of each respective sub-tree 1-5 includes an interface connection to the external system (e.g. host or file system). Therefore, each I/O connection handles all the traffic for the seven (7) nodes of the sub-tree whose root it is connected to. In the preferred embodiment, the node at the root of each sub-tree is dedicated to I/O, however, this is not always required.

Referring to FIG. 2 and virtual tree number 1, with Node A 111 at its root, a typical node 115 desiring to send data out of the structure passes a message up to the root node 111 of the virtual tree where it is forwarded to an external connection. Data arriving on the external network connection may be forwarded to a particular node such as 115 by using a broadcast filter that filters out all other nodes as described in greater detail herein. Further details regarding the operation of the global tree network, particularly with respect to functionality supporting programmable point-to-point or sub-tree messaging used for input/output, program load, system management, parallel job monitoring and debug can be found in herein-incorporated, commonly-owned, co-pending U.S. Pat. No. 7,587,516, issued Sep. 8, 2009; U.S. Patent Application Publication No. 2004-0078493, published Apr. 22, 2004; and U.S. Pat. No. 7,444,305, issued Oct. 28, 2008.

Referring back to FIG. 2, in general, I/O traffic remains within the virtual trees that have an external connection at their roots. However, if an external connection fails, another node with an external connection may be used for fail-over. For example, if the external I/O connection to Node A 111 in FIG. 2 fails, then all of the nodes in the sub-tree whose root is Node A can communicate with the external filesystem or host system through the Node B 110.

It should be understood that the hardware functionality built into the tree 20 includes, but is not limited to, integer addition, integer maximum, minimum, bitwise logical AND, bitwise logical OR, bitwise logical XOR (exclusive OR) and broadcast. The functions are implemented in the lowest latency manner possible. For example, the addition function results in the lowest byte of the word being sent first on the global network. This low byte is immediately added to the other bytes (in hardware) from the other sources with the result being shifted out to the next level of the tree. In this way, an 8-byte word, for example, has already progressed up several layers of the tree before the high order byte is shifted out. This results in the possibility for a very low latency addition over the entire machine. As is explained in co pending U.S. Pat. No. 7,313,582, issued Dec. 25, 2007, entitled "Arithmetic Functions in Torus and Tree Networks", other arithmetic functions such as minimum and subtraction can be accomplished by suitable preconditioning of the data. Floating point summation can also be accomplished by 2 passes on the tree, all at very low latency compared to methods to accomplish this result without a global combining tree. Always an arithmetic or logical operation on the tree results in a flow up the tree, where all results are combined, and a subsequent flow from the root back down the tree, distributing the result to all branches. As will be described, certain branches can be omitted from the calculation in a controlled fashion.

Figure 3:
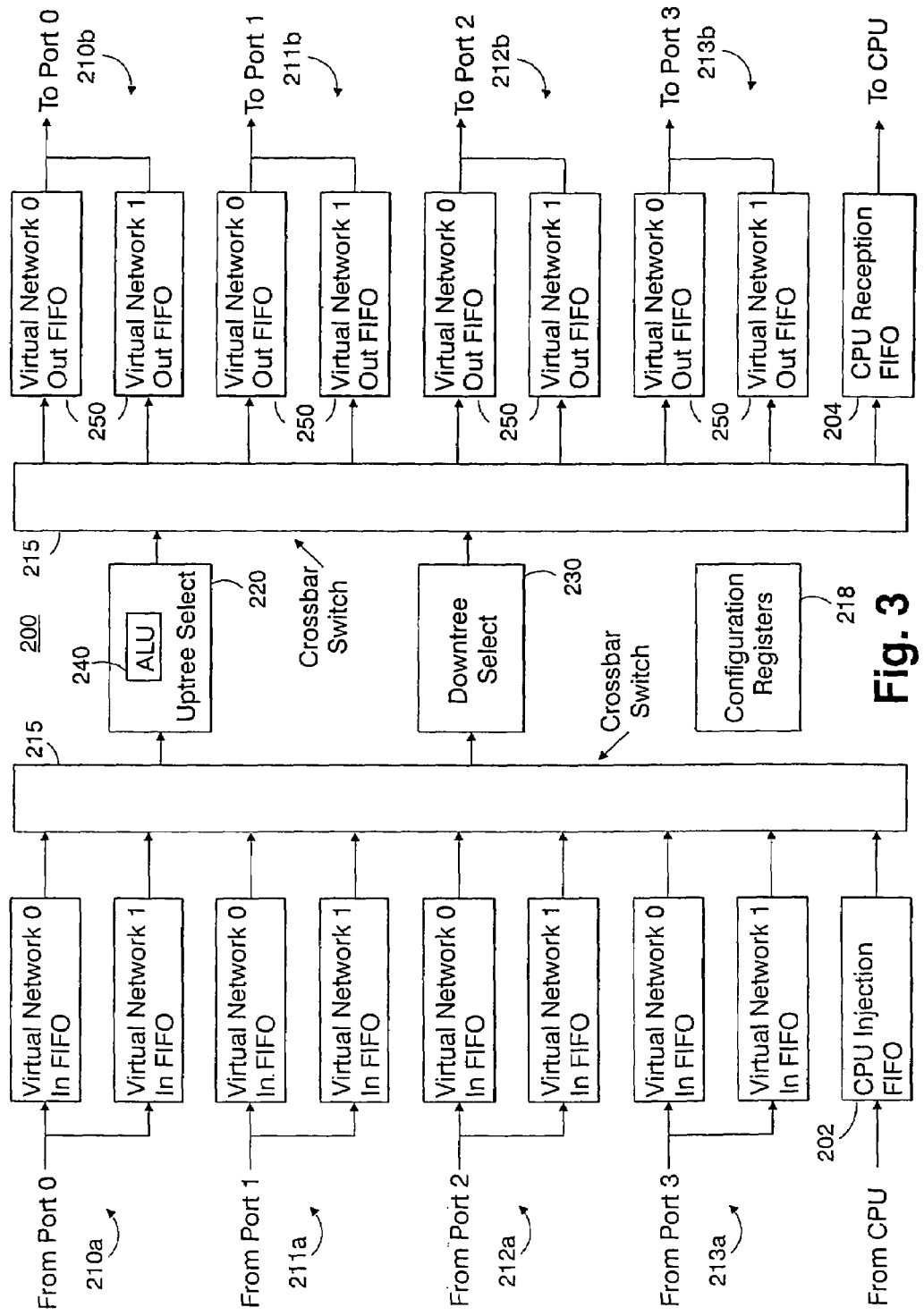
FIG. 3 illustrates the basic architecture of a router device implemented in the global tree network of FIG. 2.

In the preferred embodiment, the global tree network of the present invention comprises interconnected routers, one per node, that each move data as well as compute collective reductions. FIG. 3 illustrates the basic architecture of a router device 200 for the tree network of FIG. 2. As shown in FIG. 3, each router device 200 includes a number of ports, e.g. four, that may either be connected to another router, or disabled when not connected. As shown in FIG. 3, the router has four input ports 210a-213a and corresponding four output ports 210b-213b to form datapaths that permit a 3-tree to be constructed. In one embodiment, only one of the four ports may be designated as a connection to a parent node, and up to three of the remaining ports can be connected to child nodes. A leaf node at the bottom of the tree will have only the one port connected to its parent node enabled, while the root of the tree will have no parent enabled, but at least one child enabled. It is understood that the datapaths are created through a crossbar switch 215 as shown in FIG. 3.

For purposes of description, in the router device 200 of FIG. 3, data always flows from left to right. Thus, a packet may enter the router device 200 from either a local injection FIFO 202 or, one of the router's input ports 210a-213a. If the packet enters a port, then it is placed into one of two input FIFOs (e.g., A or B) depending on which of the two virtual networks it is. The packet is eventually consumed by either logic and arithmetic operations executed by ALU unit 240 provided in uptree select block 220 or, the downtree select block 230. The result of the uptree logic or the downtree selection is broadcast to all four output stages 210b-213b, each of which may or may not handle it depending on the operation and output ports it is destined for. The select blocks 220, 230 include an arbiter circuit (not shown) that decides where a packet (or packets) is (are) to move through the router. It is understood that there may be simultaneous uptree and downtree traffic.

Software access to the tree is provided by the injection and reception interfaces 202, 204, and a set of configuration registers 218. In general, the configuration registers 218 are used to configure the router and determine its status, while the injection and reception interfaces 202, 204 are used by applications to provide operands and receive results respectively. More particularly, each virtual tree is configured by storing appropriate values into each router's virtual tree configuration registers 218 of which there is one per virtual tree. For each virtual tree, the configuration register permits a node to specify whether or not it is to function as: 1) the root of the tree, 2) whether or not it is participating in the tree, and/or 3) whether or not it should force reception of uptree broadcast packets. In addition, the virtual tree configuration register 218 enables a node to specify which of its children either participate in the tree, or have participants below them. This is necessary for supporting sparse trees.

Applications interact with the tree through the CPU injection 202 and CPU reception 204 interfaces. Data is sent into the tree by being stored as a packet into the injection interface 202, either explicitly or through direct memory access (DMA). Similarly, results are removed from the tree by being read as a packet from the reception interface 204, either explicitly or through DMA.

Although not shown, it is understood that a flow control technique is implemented between routers using, for example, a token-based protocol that permits several packets worth of slack. That is, every output port 210b-213b that is enabled is connected to a single input port of another router. Generally, each virtual channel of that input port grants the corresponding virtual channel of the output port a token for every packet worth of buffer space in its input FIFO. The output port consumes, tokens as it sends packets, and the input port returns tokens to the output port as if frees FIFO space. Therefore, the output port may continue to send packets as long as it has tokens available.

The Arithmetic and Logic Unit (ALU) block 240 within the router device of the preferred embodiment is enabled to perform five reduction operations on four operand sizes. The operations are integer addition, integer maximum, bitwise logical OR, bitwise logical XOR, and bitwise logical AND. The operand sizes are 32 bits, 64 bits, 128 bits, and 2048 bits. It should be understood that the architecture depicted in FIG. 3 does not preclude a different choice for operations or operand sizes. Particularly, software is employed for selecting the operation and operand size.

Typically, those nodes which participate in reduction operations inject "reduction"-type packets by storing them in the CPU injection FIFO 202. Reductions are performed at the granularity of packets, where a packet, according to one embodiment, carries a payload of 256 bytes, for example. An individual packet will always carry operands of the same size, and perform the same reduction on all of the operands. Any node can be configured not to participate in reductions for each virtual tree. In this case, the node will not supply any data to reductions and will not receive results.

For each virtual tree, the router device 200 is configured to specify which of its children will be participating in reductions. When it receives a reduction packet from each of its participating children and the local injection FIFO (unless the local node is not participating), it computes the specified reduction operation on the contents of the packets and sends the results as a single packet to its parent. That is, the first word of each packet is combined to produce the first word of the result packet. The second word of each packet is combined to produce the second word of the result packet, and so forth. In this manner, the global result is recursively computed up the tree, finally completing at the root node of the reduction tree as a single packet containing the results.

Preferably, any node can be configured as the root of a virtual reduction tree. Once the reduction reaches that node, the single, combined packet is either received, broadcast to all of the participating children, or both. When a router receives a reduction packet destined for a child node downtree, it forwards copies of the packet to each of its children. It also places a copy of the packet in its local reception FIFO 204 if it is configured to participate in reductions on that virtual tree.

In a preferred embodiment, the width of the physical interconnect is narrower than the operand width, so operands are transmitted on the tree in a serialized manner. In order to achieve the lowest possible latency, integer operands are transmitted with the lowest order bits first so that results can be calculated and even forwarded as operands arrive. In this way, a result has potentially progressed up several levels of the tree before its high order bits are shifted out, resulting in very low latency over all the nodes. It should be understood that the pipelined maximum operation is computed beginning with the word containing the highest order bits because numbers are found to be different based on the highest order bit in which they differ. The hardware automatically reverses injected and received maximum operands so that the computation is performed from high order to low order bits.

The integer reductions may additionally be used to compute floating point reductions. For example, a global floating point sum may be performed by utilizing the tree two times, wherein the first time, the maximum of all the exponents is obtained, and in the second time, all the shifted mantissas are added.

As mentioned, the tree network 100 of the invention is an ideal structure for performing efficient global broadcasts. A hardware broadcast operation is always performed from the root of the tree, but any node may broadcast by first sending a point-to-point, "broadcast"-type message to the router device at the root node, which then starts the broadcast automatically. For the most part, global broadcasts respect the rules and restrictions of reductions, but differ in their uptree behavior. Any node may perform a broadcast of a payload by injecting a packet of the broadcast type on a virtual tree. The packet travels unaltered up the tree until it reaches a node configured as the root of the virtual tree. There it is turned around and broadcast to all of the participating children on that virtual tree. Therefore, it will only be received by those nodes participating in reductions on that virtual tree.

Reception of broadcasts, according to the invention, is further controlled by filtering information included within the packet. The filtering mechanism of the preferred embodiment functions by matching a value included in the packet to a preconfigured value stored in each router, and only receiving the packet if the values match. In general, every node in the system is assigned a unique value (address), so this broadcast filtering mechanism allows a message to be sent from the root node to a single node below it. It is also possible to use non-unique addresses to cause reception by a subset of the nodes. There are many ways in which broadcast filtering could be generalized. For example, use of a bit vector instead of an address would allow multiple, disjoint, configurable subsets of nodes to receive broadcasts.

Efficient sharing of external I/O connections is provided by a combination of broadcast filtering and a "root" packet type. The root-type packet always travels up a virtual tree until it encounters a node designated as a root of that tree, where it is unconditionally received. This allows non-root nodes to send messages to the root, where they can be forwarded to the external connection. Data arriving on the external connection may be forwarded to a particular non-root node using a filtering broadcast with an address that matches the intended destination.

If an external connection fails, the nodes using that connection may fail over to the next node up the tree with an external connection. For traffic from the nodes, this is performed by simply reconfiguring the node at the failed external connection so that it no longer becomes the root of the virtual tree, and reconfiguring the failover node as the new root. Traffic to the nodes is more complicated because a broadcast from the failover root will go to all the children of that node, not just the children below the failed node. For example, if node A 111 fails over to node B 110 in FIG. 2, then packets from node B will be broadcast to the entire tree.

In order to prevent unnecessary traffic, any router device may be configured to block downtree traffic on each virtual tree independently. Packets entering the router on the uptree link for a virtual tree that is configured to block are simply dropped. For example, suppose that the nodes below node A 111 in FIG. 2 are using virtual tree labeled tree 1 to send and receive external I/O using the connection at node A 111. To fail the connection at node A over to node B, node B is configured to be the root of virtual tree 1 instead of node A, and nodes C and D are configured to block downtree traffic on virtual tree 1. It should be readily understood that this downtree blocking mechanism may be used in general to prune virtual trees.

Any packet may be injected into the tree network with an interrupt request attached. The eventual effect of this is to cause a maskable interrupt at every node that receives the packet or, in the case of reductions, a result computed from the packet. A reduction result will cause interrupts if any of the injected packets contributing to that result requested an interrupt. Furthermore, a global reduction operation can be used to perform a software barrier with the interrupt mechanism. Briefly, each node enters the barrier by clearing its interrupt flag and then contributing to the global reduction. It detects the completion of the barrier by polling on the interrupt flag or receiving an interrupt. Further details regarding the operation of the global combining tree and barrier network may be found in detail in herein-incorporated, commonly-owned, co-pending U.S. Pat. No. 7,444,385, issued Oct. 28, 2008.

The tree network of the invention guarantees the correct completion of operations as long as they follow basic ordering rules. That is, because packets are processed by the routers 200 in the order in which they are received, deadlock of a virtual network results if the nodes participating in operations on a virtual tree do not inject reduction operands in the same order, or fail to inject an operand. Similarly, deadlock may occur if two virtual trees overlap on the same virtual network, and operand injection violates the strict ordering rule of the virtual network. Preferably, there are no ordering restrictions on broadcast or point-to-point messaging operations, and these operations may be interleaved with reductions.

Guaranteed completion of correctly ordered operations is provided by a hardware error recovery mechanism. Briefly, each router retains a copy of every packet that is sends across a global tree network link until it receives an acknowledgment that that packet was received with no error. A link-level communication protocol such as a sliding window protocol with packet CRC may be implemented that includes a mechanism for detection of corrupted packets, and a mechanism to cause those packets to be retransmitted using the saved copy.

As mentioned, flow control is maintained through the use of a token-based communication protocol. An "upstream" router sending packets to a "downstream" router has some number of tokens which represent the amount of free storage capacity in the downstream router. Whenever the upstream router sends a packet, it consumes a token, and it cannot send the packet unless it has a token left. Conversely, the downstream router issues tokens to the upstream router whenever it frees storage space. The balance between storage space and packet latency ensures that the link be kept busy constantly.

In a downtree broadcast where a single packet is typically sent over multiple downtree links, as well as received locally, flow control may be implemented to prevent a packet from advancing until tokens are available on all of the downtree links and there is room in the CPU receive FIFO 204. However, this conservative approach may affect throughput for filtering broadcasts intended for a single destination, because that destination could be below a link that has tokens, while the packet waits on another link that does not. Thus, in the preferred embodiment, the tree network performs an "aggressive" broadcast, which essentially decouples flow control on the individual downtree links. Referring to FIG. 3, a packet is forwarded to the Out FIFOs 250 of the appropriate downtree links and virtual network as soon as there is sufficient storage space available in all of them. Each Out FIFO 250 is then individually drained to its output port 210*b*-213*b* as tokens become available. Note that the individual copies of the packet must be placed in each Out FIFO 250 anyway for the purpose of transmission error recovery through retransmission, described earlier.

In the preferred embodiment, as described in greater detail in commonly-owned, co-pending U.S. patent application Ser. No. (YOR9-20,010,211US2 (15275)) entitled "A Novel Massively Parallel Supercomputer", and described herein with respect to FIGS. 1-3, each processing node 12 is based on a system-on-a-chip process, i.e., all functions of the computer node, including the routing functions, are integrated into a single ASIC, resulting in dramatic size and power reduction for the node size. This supercomputer architecture is further leveraged to increase node density thereby decreasing the overall cost/performance for the machine. Each node preferably incorporates many such functions into the computer ASIC including, but not limited to: a PowerPC 440 embedded processing core, a Floating Point core, embedded DRAM, integrated external DDR memory controller, message processor, Ethernet adapter, as well as the network routers. In one embodiment, the same compute ASIC node may be used as an I/O node which is associated with a subset of the compute nodes, e.g. 64 nodes, for handling fileserver communication and I/O operations. That is, the I/O nodes are very similar to the compute nodes however, may differ only in the respect of external memory configuration and, in the addition of an external network interface, such as a Gigabit Ethernet, for example. It should be understood that the tree network router described herein can function as a stand-alone device in addition to the integrated device of the preferred embodiment.

While the invention has been particularly shown and described with respect to illustrative and preformed embodiments thereof, it will be understood by those skilled, in the art that the foregoing and other changes in form and details may be made therein without departing from the spirit and scope of the invention which should be limited only by the scope of the appended claims.

The invention claimed is:

1. A method for performing collective reductions, broadcasts, and message passing during parallel algorithm operations executing in a computer structure having a plurality of interconnected processing nodes, said method comprising:

providing router devices for interconnecting said nodes via links according to a global tree network structure, said tree structure including one or more virtual sub-tree structures; and, enabling low-latency global processing operations to be performed at nodes of said virtual sub-tree structures, said global operations including global broadcast operations downstream from a root node to leaf nodes of specified said virtual sub-tree structures, global reduction operations upstream from leaf nodes to root node in said virtual sub-tree structures, and point-to-point message passing from any node of said virtual sub-tree structure to the root node of said virtual sub-tree structure as required when performing said parallel algorithm operations, the point-to-point message passing including at least one or more operands provided by an application of the global tree network, wherein each of said nodes is enabled to participate in multiple virtual trees and wherein simultaneous uptree and downtree traffic exist in one or more of said virtual sub-tree structures.

2. The method as claimed in claim 1, wherein said computing structure includes a plurality of processing nodes interconnected to form a first network, said method further including the step of collaboratively or independently utilizing said global tree network structure and first network in accordance with bandwidth and latency requirements of a parallel algorithm for optimizing parallel algorithm processing performance.

3. The method as claimed in claim 1, wherein a root node of each virtual sub-tree network structure functions as an I/O node including a connection to an external system, said method including the step of performing node I/O operations for that virtual sub-tree network structure independent of operations performed in said first network.

4. The method as claimed in claim 3, wherein each node includes a router, each said node router includes input devices for receiving packets from other nodes of a virtual sub-tree network structure, output devices for forwarding packets to other nodes of said tree, a local injection device for injecting packets into said tree, and a local reception device for removing packets from said tree, said method further including the step of configuring said node router to either participate or not participate in a virtual tree.

5. The method as claimed in claim 3, wherein said node router configuring step further comprises the step of specifying participation of a node as a root of a virtual tree when performing reduction operations.

6. The method as claimed in claim 5, wherein said node router configuring step further comprises one or more steps of:
  specifying participation of said processing node coupled to said node router for injecting operands during reduction operations.

7. The method as claimed in claim 6, further comprising the steps of: configuring said node router to compute a specified reduction operation on packet contents received from contributing children nodes and said processing node, and causing transmission of computation results to that node router's upstream parent node via an output device.

8. The method as claimed in claim 7, further including the step of recursively causing a global combined result to be computed up said virtual tree for completion as a single packet at said root node.

9. The method as claimed in claim 8, further including the step of broadcasting a single, combined packet at said root node to each all of the participating children configured to contribute operands to reductions on that virtual tree.

10. The method as claimed in claim 3, further including the step of enabling compute nodes to send point-to-point packets to an I/O node at the root of a virtual tree that are destined for an external system via said connection.

11. The method as claimed in claim 9, further comprising the step of controlling reception of broadcast packets at nodes of a virtual tree, said controlling reception being based upon an address of said node and its participation in said virtual tree.

12. The method as claimed in claim 11, wherein each node includes an address, said method further comprising the step of enabling point-to-point and sub-tree messaging among nodes of each said virtual tree, said address enabling a host system to directly communicate to every node or a subset of the nodes.

13. The method as claimed in claim 9, further including the step of: generating a hardware interrupt to a processor of a processing node based on the contents of a packet received by the local reception device.

14. The method as claimed in claim 9, further including the step of: independently blocking unnecessary downtree traffic on each virtual tree.

15. The method as claimed in claim 11, further comprising the step of providing flow control between routers when communicating packets.

16. The method as claimed in claim 15, further comprising the step of enabling aggressive broadcasting of packets on individual downstream links by decoupling said mechanism for providing flow control.

17. Apparatus for performing collective reductions, broadcasts, and point-to-point message passing during parallel algorithm operations executing in a computing structure comprising a plurality of processing nodes, said apparatus comprising:
  a global tree network including routing devices interconnecting said nodes in a tree configuration, said tree configuration including one or more virtual tree networks thereof, said global tree network enabling global processing operations including: global broadcast operations downstream from a root node to leaf nodes of specified virtual tree networks, global reduction operations upstream from leaf nodes to the root node in said virtual tree network, and point-to-point message passing from any node of said virtual tree to the root node of said virtual tree as required,
  wherein said global tree network and routing device configuration are optimized for providing low-latency communications in said computing structure.

18. The apparatus as claimed in claim 17, wherein said computing structure includes a plurality of processing nodes interconnected to form a first network, said one or more virtual tree networks and said first network are collaboratively or independently utilized according to bandwidth and latency requirements of a parallel algorithm for optimizing parallel algorithm processing performance.

19. The apparatus as claimed in claim 17, wherein a root node of a virtual tree network functions as an I/O node including a connection to an external system, said I/O node performing I/O operations for that virtual tree network independent of processing performed in said first network.

20. The apparatus as claimed in claim 19, wherein each node comprises a router having input devices for receiving packets from other nodes of a virtual tree network, output devices for forwarding packets to other nodes of said virtual tree network, a local injection device for injecting packets into said virtual tree network, and a local reception device for removing packets from said virtual tree network, said apparatus further including means for configuring said node router to either participate or not participate in said virtual tree network.

21. The apparatus as claimed in claim 20, wherein said means for configuring said node router further specifies participation of said node as said root node of a virtual tree network for reduction operations.

22. The apparatus as claimed in claim 21, wherein said means for configuring said node router further specifies participation of input devices and the local injection device for providing operands during reduction operations.

23. The apparatus as claimed in claim 22, wherein said node router further includes means for computing a specified reduction operation on packet contents received by contributing input devices and the local injection device if it is contributing, and means for causing transmission of computation results to that node router's upstream parent node via said output device.

24. The apparatus as claimed in claim 23, wherein said virtual tree network is programmed for recursively causing a global combined result to be computed up said virtual tree network for completion as a single packet at said root node.

25. The apparatus as claimed in claim 24, further including means for broadcasting a single, combined packet at said root node to each all of the participating children configured to contribute operands to reductions on that virtual tree network.

26. The apparatus as claimed in claim 19, further including mechanism for enabling compute nodes to send point-to-point packets to an I/O node at the root of a virtual tree network that are destined for an external system via said connection.

27. The apparatus as claimed in claim 25, further comprising filter mechanism for controlling reception of broadcast packets at nodes of a virtual tree network, said controlling reception being based upon a node address and participation in said virtual tree.

28. The apparatus as claimed in claim 27, wherein each node includes an address, said apparatus further comprising programmable means enabling point-to-point messaging among nodes of each said virtual tree, said address enabling an external host system to directly communicate to every node or a subset of the nodes.

29. The apparatus as claimed in claim 25, further including a mechanism for generating a hardware interrupt to a processor of a processing node based on the contents of a packet received by the local reception device.

30. The apparatus as claimed in claim 25, further including a mechanism for blocking unnecessary downtree traffic on each virtual tree independently.

31. The apparatus as claimed in claim 27, further comprising a mechanism for providing flow control between routers when communicating packets.

32. The apparatus as claimed in claim 31, further comprising means enabling broadcasting of packets on individual downstream links decoupled from said mechanism for providing flow control to perform aggressive broadcasting.

33. The apparatus as claimed in claim 18, wherein said first network includes an n-dimensional torus, where n is greater or equal to one.

* * * * *